(12) United States Patent
Steinwandel et al.

(10) Patent No.: US 10,822,686 B2
(45) Date of Patent: Nov. 3, 2020

(54) STRUCTURE OR STRUCTURAL MEMBER FOR HIGH TEMPERATURE APPLICATIONS AND METHOD AND APPARATUS FOR PRODUCING THEREOF

(71) Applicant: Airbus Defence and Space GmbH, Ottobrunn (DE)

(72) Inventors: Jürgen Steinwandel, Uhldingen-Mühlhofen (DE); Christian Wilhelmi, Höhenkirchen-Siegertsbrunn (DE); Franziska Uhlmann, Munich (DE); Stefan Laure, Stuttgart (DE)

(73) Assignee: AIRBUS DEFENCE AND SPACE GMBH, Ottobrunn (DE)

( * ) Notice: Subject to any disclaimer, the term of this patent is extended or adjusted under 35 U.S.C. 154(b) by 0 days.

(21) Appl. No.: 15/919,661

(22) Filed: Mar. 13, 2018

(65) Prior Publication Data
US 2020/0010945 A1    Jan. 9, 2020

Related U.S. Application Data

(62) Division of application No. 14/993,585, filed on Jan. 12, 2016, now Pat. No. 10,344,369.

(30) Foreign Application Priority Data

Jan. 13, 2015 (DE) .................. 10 2015 100 441

(51) Int. Cl.
| | |
|---|---|
| C23C 4/10 | (2016.01) |
| C23C 4/02 | (2006.01) |
| H05H 1/34 | (2006.01) |
| H05H 1/42 | (2006.01) |
| C23C 4/134 | (2016.01) |

(52) U.S. Cl.
CPC .................. *C23C 4/10* (2013.01); *C23C 4/02* (2013.01); *C23C 4/134* (2016.01); *H05H 1/34* (2013.01);
(Continued)

(58) Field of Classification Search
None
See application file for complete search history.

(56) References Cited

U.S. PATENT DOCUMENTS

| | | | |
|---|---|---|---|
| 3,387,110 A | 6/1968 | Wendler et al. | |
| 5,420,084 A * | 5/1995 | Morel ...................... | C03C 8/14 427/201 |

(Continued)

FOREIGN PATENT DOCUMENTS

| | | |
|---|---|---|
| CN | 103874313 A | 6/2014 |
| DE | 690 08 140 T2 | 8/1994 |

(Continued)

OTHER PUBLICATIONS

Office Action for the corresponding European application No. 16150888.2, dated May 13, 2016.
(Continued)

*Primary Examiner* — John J Figueroa
(74) *Attorney, Agent, or Firm* — Global IP Counselors, LLP

(57) ABSTRACT

A structure for high temperature applications includes a base structure which includes a ceramic composite material, and a coating of a metal-semimetal compound, a metal boride, a metal carbide and/or a metal nitride. Furthermore, a production method and a coating device produces structures which resist high temperature applications with higher process temperatures and difficult chemical conditions.

11 Claims, 10 Drawing Sheets

(52) U.S. Cl.
CPC ....... *H05H 1/42* (2013.01); *H05H 2001/3484* (2013.01)

(56) References Cited

U.S. PATENT DOCUMENTS

| | | |
|---|---|---|
| 5,780,157 A | 7/1998 | Tuffias et al. |
| 2006/0110609 A1* | 5/2006 | Eaton .................... C04B 41/009 428/446 |
| 2007/0275267 A1 | 11/2007 | Sabouni et al. |
| 2010/0266781 A1 | 10/2010 | Kusinski et al. |
| 2013/0108886 A1* | 5/2013 | Jahrling .................... C23C 4/06 428/601 |

FOREIGN PATENT DOCUMENTS

| | | |
|---|---|---|
| DE | 694 00 098 T2 | 10/1996 |
| DE | 695 22 098 T2 | 6/2002 |
| DE | 10 2004 006 636 A1 | 8/2005 |
| DE | 603 07 254 T2 | 8/2007 |
| DE | 10 2007 058 484 A1 | 10/2008 |

OTHER PUBLICATIONS

Yang X et al, "ZrB2/SiC as a Protective coating for C/SiC composites: Effect of high temperature oxidation on mechanical properties and anti-ablation property", Composites Part B: Engineering, Bd. 45, Nr. 1, Jul. 24, 2012.

\* cited by examiner

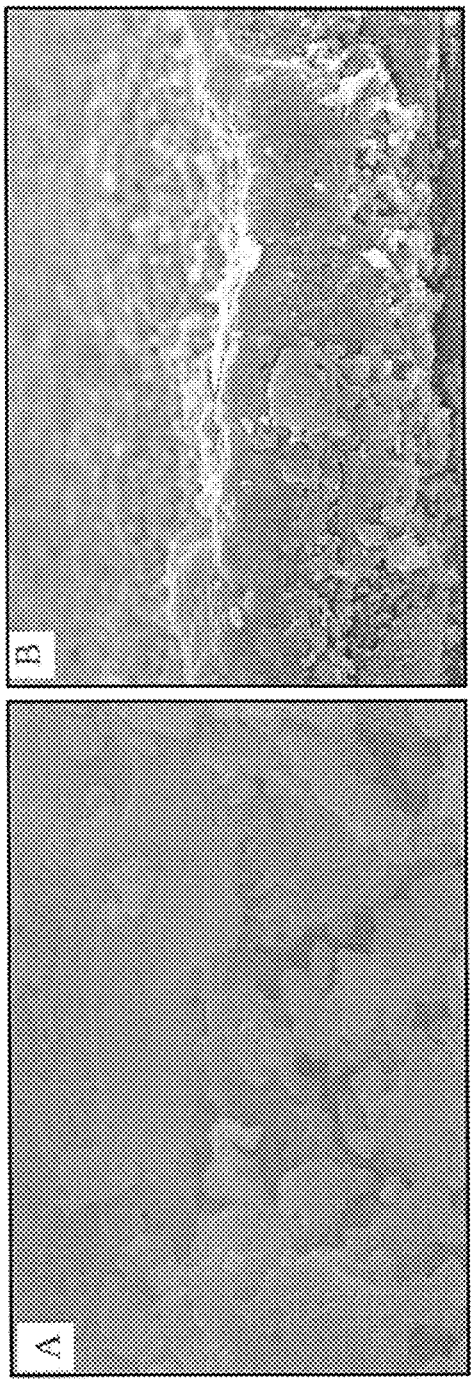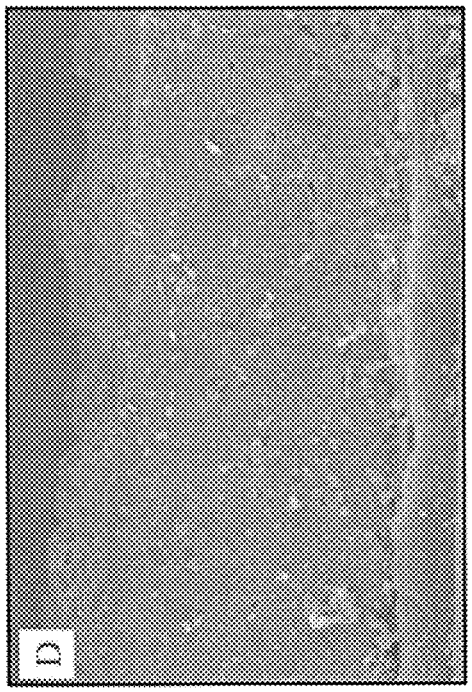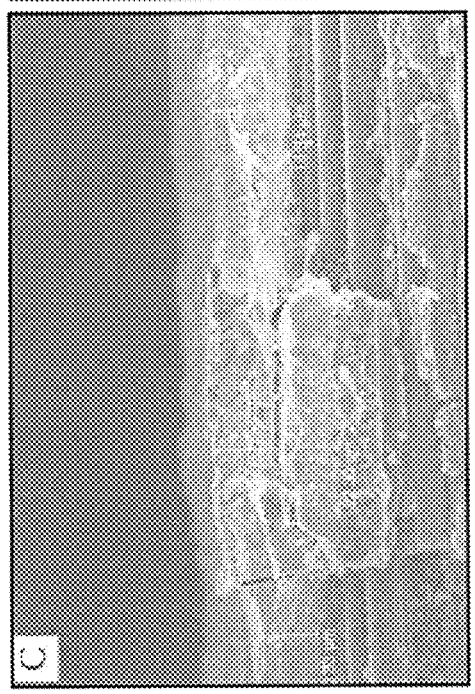
FIG. 8A
FIG. 8B
FIG. 8C
FIG. 8D

STRUCTURE OR STRUCTURAL MEMBER FOR HIGH TEMPERATURE APPLICATIONS AND METHOD AND APPARATUS FOR PRODUCING THEREOF

CROSS-REFERENCE TO RELATED APPLICATIONS

This application is a divisional application of application Ser. No. 14/993,585, filed Jan. 12, 2016, which claims priority to German Patent Application No. 10 2015 100 441.0 filed on Jan. 13, 2015, the disclosures of each of which are hereby incorporated herein by reference in their entirety.

BACKGROUND OF THE INVENTION

Field of the Invention

This invention relates to a structure or a structural member for high temperature applications and a method for producing a structure or a structural member for high temperature applications, as particularly for combustion chambers and/or other applications, as for example further engine components, components for hypersonic motors/hypersonic vehicles, thermal protection systems for the reentry area, more especially for the aviation sector and/or space technology. Furthermore, this invention relates to a method and a device for coating a base structure.

Description of Related Art

Combustion chambers of engines for machines, vehicles, aircrafts and spacecrafts, e. g. missiles or rockets, must be able to withstand high thermomechanical and thermochemical stress during operation.

US 2010/0266781 A1 discloses a method to improve corrosion, abrasion, and fire resistant properties of structural components for use inter alia in petrochemical applications. DE 603 07 254 T2 relates to the deposition of a protective coating against oxidation on pieces and parts, respectively, made from thermostructured composite materials. A method for depositing a multilayer coating on workpieces and/or materials may be found in DE 10 2007 058 484 A1. German OS 1 571 171 describes a plasma spray gun. A method for producing thermal coarse spray coatings is disclosed in DE 695 22 098 T2. Furthermore US 2007/0275267 A1 describes a mechanical seal structure with at least one ceramic seal face. U.S. Pat. No. 5,780,157 discloses a refractory composite structure which is produced by chemical vapor deposition techniques (CVD).

SUMMARY

It is an object of the present invention to provide a structure member for high temperature applications, which fulfils the above mentioned requirements in a light weight construction and which additionally allows for still higher operation temperatures than have been possible so far.

For this purpose the invention proposes a structure or a structure member, and a method for producing structures, for high temperature application according to the independent claim and a device for carrying out at least partial steps of the production method, especially for carrying out a coating.

According to a first aspect the invention provides a structure for high temperature application comprising a base structure including a ceramic composite material and a coating of a coating material which contains at least one metal-semimetal compound, at least one metal boride, at least one metal carbide and/or at least one metal nitride. It is preferred that the base structure has fibers and a matrix and/or that the coating has a thickness of 0.1 μm to 200 μm.

It is preferred that the fibers are formed from one or several fiber materials, which are selected from the group of fiber materials which comprises C, ceramic materials, SiC, HfC, ZrC, TaC, TiC, $ZrB_2$, $HfB_2$, $TiB_2$, $TaB_2$ and $NbB_2$ and nitride materials.

It is preferred that the matrix is formed from one or several matrix materials which are selected from a group of matrix materials comprising C, ceramic matrix materials, SiC, SiSiC, HfC, ZrC, TaC, TiC, $ZrB_2$, $HfB_2$, $TiB_2$, $TaB_2$ and $NbB_2$ and nitride materials. It is preferred that the coating is formed from a metal boride. It is also preferred that the coating is formed from a metal carbide. It is further preferred that the coating is selected from one or several coating materials of a group of coating materials comprising SiC, HfC, ZrC, TaC, TiC, $ZrB_2$, $HfB_2$, $TiB_2$, $TaB_2$ and $NbB_2$ and nitride materials. It is also preferred that the coating is formed from $ZrB_2$ and SiC.

It is preferred that the base structure comprises carbon fibers $C_f$ and an SiC matrix. It is also preferred that the coating has at least one glassy substance. It is further preferred that the coating has at least one graded surface. It is also preferred that the coating has at least a mixture of a metal oxide with boron oxide or semimetal oxide at its surface.

It is preferred that the above described structures of the present invention are obtainable according to a method of the present invention according to the following second aspect. According to a second aspect the invention provides a method for producing a structure for high temperature applications comprising:

a) providing a base structure of a ceramic composite material, especially a ceramic fiber composite material, and b) coating the base structure with a UHTC coating.

It is preferred that step a) comprises: a1) providing fibers of one or several fiber materials which are selected from a group of fiber materials comprising C, ceramic materials, SiC, HfC, ZrC, TaC, TiC, $ZrB_2$, $HfB_2$, $TiB_2$, $TaB_2$ and $NbB_2$ and nitride materials.

It is preferred that step a) comprises: a2) embedding fibers in a matrix, wherein the matrix is formed from one or several matrix materials which are selected from a group of ceramic matrix materials comprising SiC, HfC, ZrC, TaC, TiC, $ZrB_2$, $HfB_2$, $TiB_2$, $TaB_2$ and $NbB_2$ and nitride materials. It is preferred that step b) comprises: b1) pre-cleaning the base structure, especially with organic and/or inorganic solvents and/or with at least one acid. It is also preferred that step b) comprises: b2) pre-treating and preparing the base structure for the coating.

It is further preferred that step b) comprises: b3) mounting the base structure in a vacuum process chamber for plasma beam techniques. It is also preferred that step b) comprises: b4) pre-heating the base structure. It is further preferred that step b) comprises: b5) treating the base structure by means of reactive plasma beams.

Moreover, it is preferred that step b) comprises: b6) coating the base structure with at least one metal boride and/or one metal carbide and/or with a coating material which is selected from one or several of the coating materials of a group of coating materials comprising SiC, HfC, ZrC, TaC, TiC, $ZrB_2$, $HfB_2$, $TiB_2$, $TaB_2$ and $NbB_2$ and nitride materials. It is preferred that step b6) comprises: b6.1) using a powder or a powder mixture with an average grain size from 1 μm to 100 μm as a coating material—especially of a metal-semimetal compound and more especially of a metal boride. It is also preferred that step b6) comprises: b6.2) transferring the coating material, especially in powder form, into a plasma torch by means of a conveyor device. It is further preferred that step b6) comprises: b6.3) using a plasma torch with an elongated plasma channel behind a tungsten cathode, the coating material being introduced into the elongated plasma channel. It is also preferred that step b6) comprises: b6.4) introducing the coating material downstream of a cathode in order to avoid a contact between the cathode and the coating material. It is preferred that step b6) comprises: b6.5) fragmenting and/or partially evaporating the coating materials in a hot core beam of the plasma, especially for producing a cluster gas, more especially a gas of nano aggregates of the coating material, as e.g. a metal boride, in combination with simple metal-semimetal molecules (for instance of the Me-B type) and metal atoms and semimetal atoms (e. g. boron atoms). It is preferred that step b6) comprises: b6.6) expanding the gas mixture with coating material by means of an ultrasonic nozzle. It is preferred that step b6) comprises: b6.7) performing an ultrasonic method for concentrating heavier components of the cluster gas or the gas mixture with coating material in the center of the gas beam.

It is preferred that step b4) comprises:
b4.1) pre-heating by means of the enthalpy and/or the temperature of a plasma beam. It is preferred that step b4) comprises: b4.2) variation of the plasma power dependent on the process duration and/or the evaporation enthalpy and/or the fragmentation enthalpy of the coating materials. It is preferred that step b4) comprises: b4.3) immediate electrical heating of the base structure by introducing a heating current into the base structure. It is preferred that step b4) comprises: b4.4) heating and/or keeping warm of the base structure at a process temperature in the range from 300° C. to 1400° C. and more especially in the range from 500° C. to 1100° C. It is preferred that step b4) comprises: B4.5) capturing the temperature of the base structure, preferably by means of at least one thermocouple, and controlling the heating processes.

It is also preferred that the method comprises: c) superficial transformation of the metal-semimetal coating materials, as especially borides, by means of oxygen into a glassy substance and/or into mixtures of metal oxides with semimetal oxides, especially boron oxide.

According to a third aspect the invention provides a device for use in a method according to the present invention, especially for carrying out step b), comprising: a process chamber, a device for producing a plasma beam having a cathode and an elongated plasma channel downstream of the cathode for guiding a plasma beam and a device for introducing a coating material for introducing a coating material downstream of the cathode. The device comprises preferably at least one flow body for guiding the plasma beam more into the direction of a wall of the base structure to be coated.

BRIEF DESCRIPTION OF THE DRAWINGS

In the following preferred embodiments of the present invention will be illustrated by means of the attached drawings. In these drawings:

FIGS. 8A through 8D show SEM images of HPPC based $ZrB_2$ coatings on Cf/SiC SiCARBON™ substrates with a coating time of 12 s in FIG. 8A, 60 s in FIG. 8B, 90 s in FIG. 8C, 120 s in FIG. 8D;

DETAILED DESCRIPTION OF EMBODIMENTS

Figure 1:
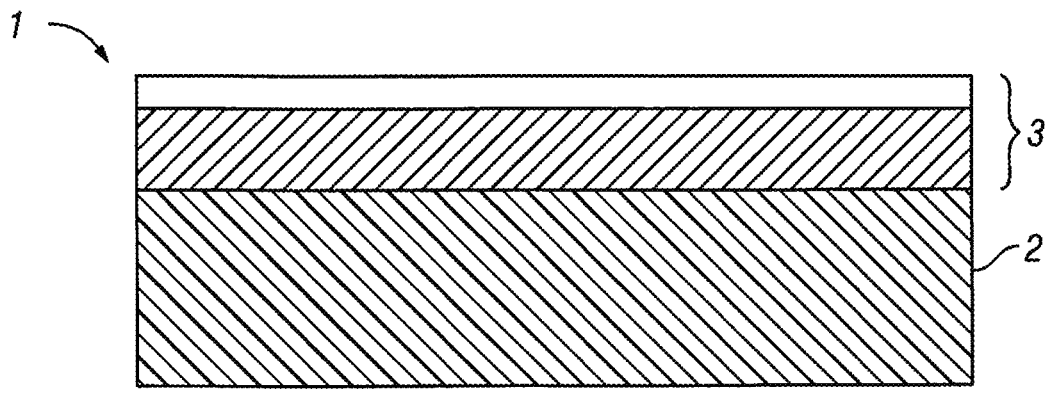
FIG. 1 shows a schematic sectional view of an embodiment of a structure for high temperature applications.

FIG. 1 shows an embodiment of a preferred structure 1 for high temperature coatings. The structure 1 includes a base structure 2 of a ceramic fiber composite material and a coating 3 of a high temperature ceramic (UHTC=Ultra High Temperature Coating). The coating 3 may be graded or non graded. However, it is advantageously graded. The coating consists for example of a metal boride, especially $ZrB_2$, and/or metal carbides, as for example SiC, TaC, or mixtures thereof, or metal nitrides. The ceramic composite material (CMC=Ceramic Matrix Composite) is especially composed of C/SiC.

Figure 2:
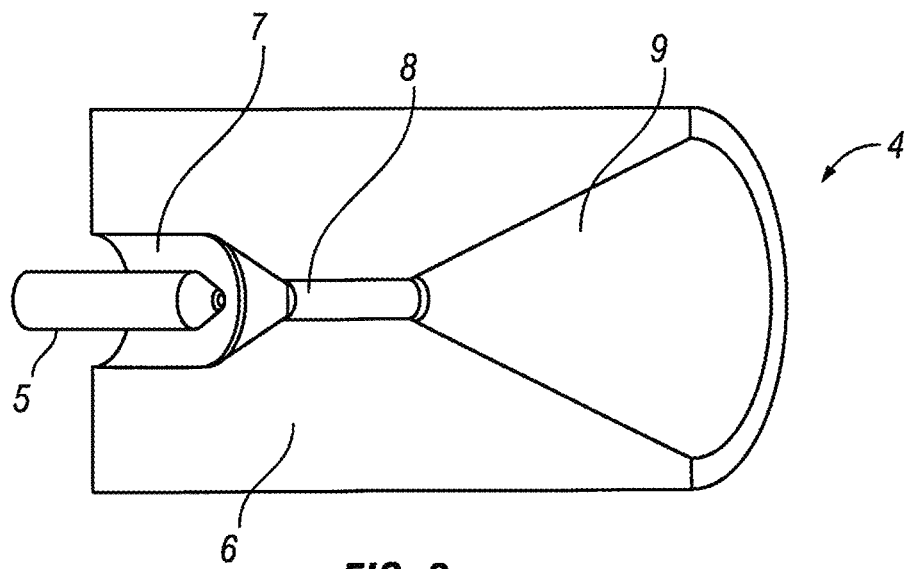
FIG. 2 shows a schematic representation of an embodiment of an arc torch for use in a coating apparatus for coating a base structure with a UHTC layer for obtaining the structure of FIG. 1.
Figure 3:
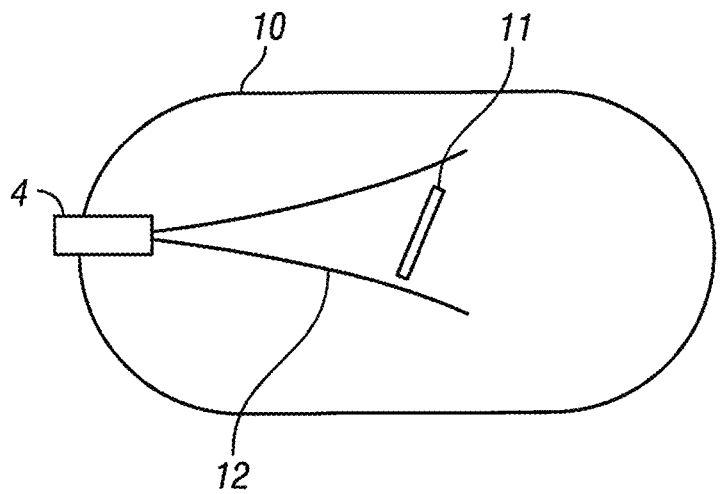
FIG. 3 shows a schematic representation of an embodiment of the coating apparatus.

FIG. 2 shows an arc torch 4 for use in a coating apparatus. The arc torch 4 according to FIG. 2 comprises a cathode 5, an anode 6, a combustion chamber 7, a nozzle throat 8 and an expansion nozzle 9. FIG. 3 shows a coating apparatus in which the arc torch 4 is arranged, which furthermore comprises a vacuum tank 10 in which a flat sample holder 11 is arranged. For the coating, for example with $ZrB_2$, the divergent plasma-ceramic beam 12 leaves the arc furnace 4 and impinges on a flat sample in the flat sample holder 11.

In the following the build up and the production of preferred structures for high temperature applications will be explained in more detail. To this it will be first explained for which specific applications the structures are especially suited and optimized, wherefrom typical assemblies or build ups of structures and structure elements constructed therefrom will arise for the skilled person. Subsequently preferred materials and the method for producing the proposed structures will be explained in more detail.

The structures and structure elements shall be used for high temperature applications, as they are especially found in connection with technical combustions and combustion engines. The structures are especially formed as members or structure members of combustion chambers or as structure members close to combustion chambers. The efficiency of technical combustions depends inter alia significantly on to what extent high combustion temperatures and combustion pressures, respectively, may be obtained. This is immediately understandable when a thermodynamic cycle is concerned.

As an example a Joule-Brayton process in an aircraft gas turbine may be mentioned. As a further example a rocket engine may be mentioned. In the case of a rocket engine the net power is obtained by means of an adiabatic expansion, which then again requires pressures and temperatures in the combustion chamber which are as high as possible.

It is now the crucial factor how much the temperature stress of the respective structure material may be raised. In general, the structure temperature does not correspond to the gas temperature, but is lower. In such applications e. g. high temperature alloys are currently employed as structure materials. Typical high temperature alloys, which are employed according to current practice—e. g. in engines of Airbus' aircrafts—for example in the field of aerospace gas turbines, are nickel base alloys and cobalt base alloys. These alloys may be used up to approximately 1200° C. (surface temperature and structure temperature, respectively) in continuous operation. For instance nickel aluminide (up to approximately 1300° C.) and niobium and tantalum (up to approximately 1.400° C.), respectively, have a higher operating temperature range. These temperatures are strongly depending on the respective alloy composition, but also on the crystal structure (e. g. single crystal materials versus polycrystalline materials) and the (mostly thermal) aftertreatment.

The decreasing strength of metallic materials at higher temperatures (inter alia caused by thermally induced imperfections—Schottky and Frenkel defects) is decisive for the structure stability. In addition there are further stability criteria. Especially the oxidation strength and the hot gas corrosion strength should be mentioned in connection therewith. These chemically induced effects occur during all technical combustions. The residual oxygen of a technical combustion depends on the combustion management. The range is relatively broad and may reach from a quasi stoichiometric/slightly overstoichiometric (examples for this are combustions in gasoline engines or rocket engines) to highly overstoichiometric combustions (examples for this are lean combustions in a gasoline engine, combustions in Diesel engines or gas turbines).

Altogether it may be stated that, as regards an extension of the temperature application range, metallic materials have reached the limits of their application ranges. An approach for a solution pursued according to an embodiment consists in switching to ceramic materials. Fiber composites are especially interesting.

In connection with the intended application untreated fiber composites have turned out not to be very suitable. Moreover, coatings of a high temperature resistant and especially oxidation resistant materials are proposed according to an embodiment.

The previously common metallic or intermetallic high temperature materials do not exhibit a sufficient strength and beyond this also no sufficient oxidation resistance at temperatures above 1.400° C. (the temperature of the structure element, as a benchmark the gas temperature is approximately 150-200° C. higher). As regards the use in gas turbines this is up to now only feasible under film cooling obtained with compressor air. In the case of rocket engines (e. g. Vulcain2) an internal cooling is not educible. Instead here an external cooling of the combustion chamber and the jet nozzle takes place by means of cryogenic hydrogen before entrance into the combustion chamber. Internal coatings are necessary for increasing the hot gas corrosion resistance and thereby extending the lifetime. The above mentioned drawbacks shall be avoided or at least alleviated with the here proposed structure materials.

In the case of smaller engines the problem of the temperature/hot gas corrosion resistance may also be solved by using high melting noble metals (Pt, Os, Ir) as combustion chamber/jet nozzle unit which, however, is extremely expensive. Parallels to this are known as coatings in the gas turbine sector (high pressure turbine) (e. g. Pt/Al).

In one embodiment ceramic materials, especially "Ultra high temperature ceramics," shortly: UHTCs, with melting points above 3000° C. are employed in order to obtain higher continuous temperature loads. Preferred examples are SiC, ZrC, HfC, TaC, TiC, $ZrB_2$, $HfB_2$, $TiB_2$, $TaB_2$ and $NbB_2$. In addition, nitride compounds may be used as well. It is basically possible to use these materials in the form of monolithic ceramics. These materials are especially used as coatings, e.g. in the structure which is displayed in FIG. 1.

For the application case presented herewith a base structure of a fiber ceramic according to a further preferred embodiment is used. This base structure has advantageously carbon long fibers with a matrix of silicon carbide (C/SiC) auf. Alternatively, amongst other further possible material combinations, for examples the following material combinations may be taken into consideration:

1. SiC fibers with SiC matrix (SiC/SiC)
2. C fibers with HfC matrix (C/HfC)
3. SiC fibers with HfC matrix (SiC/HfC)
4. HfC fibers with HfC matrix (HfC/HfC)
5. HfC fibers with SiC matrix (HfC/SiC)
6. Further materials/material combinations analogous to the coating (e. g. $ZrB_2$).

The preferred materials which are mentioned above as examples for the coatings, e. g. metal boride, metal carbide, metal nitride and especially SiC, ZrC, HfC, TaC, TiC, $ZrB_2$, $HfB_2$, $TiB_2$, $TaB_2$ and $NbB_2$ and nitridic compounds, may also be used for the matrix and optionally also for the fibers. Transition metal borides, transition metal carbides, corresponding nitrides and mixtures thereof may be preferably used for the matrix and/or the coating. The fiber materials may comprises these materials as well, and additionally carbon, especially in the form of carbon long fibers. Although these materials/material combinations are thermally stable, according to an especially preferred embodiment a protection against oxidation (residual oxygen in the combustion gas) and/or hot gas corrosion (other combustion products) is proposed for the envisaged application case.

To this end a stable coating, which consists of refractory metal borides and/or transition metal borides, especially zirconium boride, titanium boride and hafnium boride, or mixtures with other materials, as for example SiC, TaC, or which comprises such metal borides or the like, is applied onto the fiber ceramic structure. In one embodiment a protection against oxidation is obtained by superficially transforming the borides by means of oxygen into a glassy substance, e. g. by mixtures of the metal oxide with boron oxide. This is indicated in FIG. 1 by means of the presented graded surface. The grading step may be included, however, is optional. The base structure is especially produced according to a method which is shown and described in more detail in DE 10 2010 055 248 B4.

A preferred embodiment of the producing method or coating method for coating the fiber ceramic structures includes one or several or all of the following steps wherein the sub steps mentioned in the individual steps refer to preferred designs or embodiments which may be present or may be omitted or may be modified:
1. Preparing the fiber structures for the coating (e. g. from the gas phase) by applying usual surface pre-treatments, as for example sandblasting, polishing, Laser structuring or the like, and pre-cleaning methods with organic and/or inorganic solvents or acids, respectively, or with a Laser (for further details about a possible laser structuring reference is made expressly to DE 10 2012 016 203 A1, which forms part of the disclosure of the present application, correspondingly pre-structured surfaces present an especially good adhesion property)
2. Mounting the structures prepared as mentioned above in a vacuum process chamber for plasma jet techniques (open jet or contour nozzle). Treatment of the structures to be coated by means of reactive plasma jets (noble gases, especially argon, as primary gas component; oxygen, nitrogen, hydrogen as accompanying components in a range from 1-30 vol %, based on the amount of noble gas)
3. Coating the base structures with the relevant metal borides and/or other ceramic materials or mixtures thereof. For this powders or powder mixtures and/or granulates with an average grain size from 1 μm to 100 μm are used. The powders are transported to the high performance plasma torch by means of usual conveyor devices. The method differs from normal plasma spraying in which the powder is added to the expanding medium at the beam exit. Corresponding plasma torches have a fundamentally different type of construction. Core component in this case is a long plasma channel behind a tungsten cathode in which the powder mixtures are introduced. The introduction occurs downstream whereby a contact of the powder with the tungsten cathode may be avoided. This represents a particular advantage for an especially good functionality of the method, as otherwise the tungsten may form an alloy with the powders, which may affect the cathode or which may, in extreme cases, destroy the cathode. The boride powder (or the powder of another cited coating material or the powder mixture of the cited coating materials, respectively) are fragmented and partially evaporated in the hot plasma core jet. The result of this process is a so-called "cluster gas" consisting of nano aggregates of the coating materials, as for example metal borides (diameter between 10 nm and 10.000 nm) in combination with simple metal boron molecules of the Me-B type, and metal atoms and boron atoms as well). This gas mixture is expanded by a supersonic nozzle, wherein as it is known the Mach number is given by the angle of divergence or rather the relationship or proportion between the geometry of the nozzle throat and the geometry of the nozzle exit. A further necessary condition for the formation of a supersonic flow is the pressure relation between plasma torch/exit (between 0.5 and 120 bar) and the static pressure in the working chamber, (at least a factor of 30). This supersonic method leads to a concentration of the heavy components of the "cluster gases" in the center of the expanding plasma beam. Thereby an oriented plasma jet of the cluster gas with a very good mixing of the components to be deposited is obtained.
4. The structures to be coated are preferably pre-heated. The pre-heating may be obtained by means of the high enthalpy/temperature of the plasma beam as such, with the disadvantage that the temperature is controlled by means of the enthalpy/temperature of the plasma beam. This adaptation is advantageously made by generating variable plasma conditions by varying of the plasma power. For example a base power is varied between 30 kilowatts and 200 kilowatts depending on the necessary process duration and evaporation/fragmentation enthalpy of the respective metal boride. As the base structures to be coated have an electric conductivity in the range of typical heating conductors, an electrical heating of the complete structure is possible as well. The temperatures of the bodies to be coated during the coating process are advantageously in the range from 300° C. to 1400° C., more preferably in the range from 500° C. to 1100° C. The temperatures are preferably controlled by thermocouples, and the heating process is preferably controlled to the target range by variation of heating current/heating voltage.
5. Taking a structure element of a rocket combustion chamber with thrust nozzle as an example in this structure element the coating may be done from a random side in the plasma beam. The efficiency may be raised by providing flow bodies, which push the plasma with the cluster beam more into the direction of the wall to be coated. By doing so more coating material may be reacted, and the process efficiency may be increased.
6. The metal boride coatings which are produced in this way on the fiber ceramic base structures have advantageously a thickness in the range from 0.1 μm to 200 μm.

In the following preferred embodiments and their advantages will be explained in the following overview.

During operation combustion chambers, e.g. of spacecrafts with propulsion drive, have to withstand very high thermomechanical and thermochemical stress. Due to their low weight and their high temperature stability ceramic composites, especially ceramic fiber composites—for instance CMC materials (Ceramic Matrix Composite), as especially a $C_f$/SiC material, obtainable by a PIP process (polymer infiltration pyrolysis process)—represent promising materials for such applications.

In order to protect fibers, as e.g. carbon fibers, and the matrix, e g. an SiC matrix, against oxidation and/or ablation, especially above 1650° C., it is proposed to apply an EBC coating—Environmental Barrier Coating—on the composite material. A suitable UHTC coating—Ultra High Temperature Coating—based on a metal-semimetal compound, especially a metal boride, as especially $ZrB_2$, is preferably proposed.

Flat samples were used for investigating microstructures, assembly or build up and composition and adhesion behavior of the developed coatings. It was possible to produce a dense and adherent $ZrB_2$ coating, wherein the thickness could be improved from until now possible 300 nm to up to 20 μm. Furthermore the oxidation behavior and thermal shock behavior and the resistance against ablation at elevated temperature were investigated in a long term material test making use of a test facility named ERBURIG (Environmental Relevant Burner Rig test facility) of the Airbus Group using kerosene and oxygen as fuel for producing a combustion chamber like environment. Pretests with relatively thin coatings (approximately 2 μm) showed that the coating had a good adhesion during the tests and therefore represents a very promising material for the envisaged applications. Structures for high temperature applications and especially an assembly or a construction of high temperature structures with the application background of technical combustions (e. g. rocket engines, gas turbines, piston engines) are proposed.

Preferred applications may be found especially in the aviation and aerospace technology and the power engineering and/or the construction of engines and/or vehicles or their propulsion or motors. The high temperature structures may e.g. find application in the field of combustion chamber-thrust/jet nozzle for rocket engines. Moreover possibilities for an application exist for aero gas turbines and piston engines (reciprocating piston engine and rotary piston engines). Additional preferred applications consist in hypersonic engines, hypersonic vehicles, thermal protection systems during reentry from outer space into the earth's atmosphere and so forth. With the structures proposed herewith especially an extension of the temperature application range of combustion chambers and thrust nozzles in rocket engines and gas turbines-combustion chambers and/or high pressure turbines is obtained.

In order to create structures which withstand high temperature applications with higher process temperatures and challenging chemical conditions, the invention provides a structure for high temperature applications comprising a base structure, which has a ceramic composite material and a coating of a metal-semimetal compound, a metal boride, a metal carbide, a metal nitride or mixtures thereof. As the metal component a transition metal is preferably provided. Furthermore a production method and a coating device for use therein are described.

Further Embodiments

1. Production of a Structure with a Base Structure of $C_f$/SiC and a Coating of Zirconium Diboride 1.1 Production of the $C_f$/SiC Base Structure $C_f$/SiC is a ceramic composite material which comprises a matrix of silicon carbide (SiC), in which carbon fibers are embedded (SiCARBON™ of Airbus Group). In a preparational step continuous carbon fibers (type T800HB-6000-40B, Toray Industries, INC., Japan) are coated with a 350 nm thick layer of pyrolytic carbon (pyC), whereby an optimized boundary surface between fiber and matrix is obtained. The coated carbon fibers are incorporated into an SiC matrix by the polymer infiltration pyrolysis method (PIP method). In the PIP method bundles of coated carbon fibers are infiltrated with a pre-ceramic slurry system, whereafter the filaments are winded and unidirectional prepregs are obtained. Subsequently the prepregs are laminated and crosslinked under pressure in an autoclave (T=100-300° C., p=10-20 bar). In a pyrolysis step at 1100-1700° C. under nitrogen the so obtained green body samples are transformed into the ceramic composite material of an SiC matrix with carbon fibers embedded therein. As the polymer shrinks during the pyrolysis, the resulting SiC matrix has a porosity of 40 to 45 vol.-%. Due to a three times repetition of the impregnation step and the repeated pyrolysis the porosity is lowered (density: 1.78 g/cm$^3$, fiber content: 45 vol.-%, porosity: 23 vol.-%). Subsequently coupons with a size of 100×100 mm$^2$ are produced, which are cut to size with a diamond disc saw (DIADISC 6200, MUTRONIC Prazisionsgeratebau GmbH & Co. KG, Germany).

1.2 Coating the Ceramic $C_f$/SiC Composite Material with Zirconium Boride

The coating is obtained by the so-called "High Performance Plasma Coating" method (HPPC method). The $C_f$/SiC samples are prepared by a 15 min cleaning each in water and in isopropyl alcohol and then drying the samples at 90° C. Subsequently the plasma coating is carried out with the plasma torch 4 which is shown in FIG. 2 and which is mounted in the coating apparatus shown in FIG. 3. During the coating an extremely hot hydrogen argon plasma (T>10.000 K) is generated in the vacuum tank 10 of the coating apparatus. A zirconium boride powder ($ZrB_2$, Grade B, supplier: HC Starck, Germany; SiC Arendal Smelteverk, Norway)) is introduced into the hottest zone inside the plasma jet. The ceramic powder-plasma mixture is accelerated towards the flat sample holder 11 where it impinges on the $C_f$/SiC coupons under formation of the $ZrB_2$ coating.

2. Variation of the Duration of the Coating Step

The coating experiment from paragraph 1.1 is repeated four times. The coating time is 12, 60, 90 and 120 s, respectively. The thickness d of the $ZrB_2$ layer grows approximately linearly with the coating time (d=3 μm for t=12 s; d=8 μm for t=60 s; d=16 μm for t=90 s; d=20 μm for t=120 s). The obtained $ZrB_2$ coatings show independent of the coating time a relatively dense structure. The coatings are brittle and show cracks. It is supposed that this is caused by the different coefficients of thermal expansion of $ZrB_2$ ($5.9 \times 10^{-6}$ K$^{-1}$) and of $C_f$/SiC (in plane $2 \times 10'$ K$^{-1}$).

3. Coating the Ceramic $C_f$/SiC Composite Material with a Coating Powder of 90 wt.-% Zirconium Boride and 10 wt.-% Silicon Carbide The coating experiment according to paragraph 1.2 is repeated with a coating powder which comprises 90 wt.-% $ZrB_2$ and 10 wt.-% SiC. The coefficient of thermal expansion of SiC amounts to $4.3 \times 10^{-6}$ K$^{-1}$. The duration of the coating step is 90 s. The SEM investigation of the coatings reveals that the $ZrB_2$/SiC coating is less dense and more porous than the pure $ZrB_2$ coating. On the top surface single particles can be observed. The amount of cracks is significantly reduced, as compared with the pure $ZrB_2$ coating. The coating adhesion on the $C_f$/SiC composite material is improved. It is assumed that both the adaptation of the coefficient of thermal expansion to the $C_f$/SiC composite material and the increased porosity contribute to the reduced thermal stress during cooling of the samples starting from 1000-2000° C. Thus, under the given experimental conditions a coating with improved properties is obtained when admixing 10 wt.-% of SiC to the $ZrB_2$ coating powder.

Further embodiments and details of possible embodiments and designs of the invention and their advantageous embodiments are described below. The following describes examples of the structures, methods for producing these structures and devices which are described in the present patent application are described as well. These represent expressly part of the disclosure of the present patent application and invention.

The following describes additional subject matter pertaining to the embodiments described herein. This subject matter is found in a document entitled "ULTRA HIGH TEMPERATURE CERAMIC COATINGS FOR ENVIRONMENTAL PROTECTION OF Cf/SiC COMPOSITES" by Franziska Uhlmanna, Christian Wilhelmia, Steffen Beyerb, Stephan Schmidt-Wimmerb, Stefan Laurec, which is incorporated by reference herein. In this work a $ZrB_2$ based Ultra High Temperature Coating (UHTC) via High Performance Plasma Coating (HPPC) is developed for the application background of Cf/SiC combustion chambers of orbital thrusters. Microstructure, composition and adhesion behavior of the coatings are studied on flat samples. Dense and adherent $ZrB_2$ based coatings with a thickness of up to 200 μm are fabricated. Furthermore the oxidation and thermal shock behavior as well as the ablation resistance at elevated temperatures are investigated by material testing in the Airbus Group "Environmental Relevant Burner Rig-Kerosene" (ERBURIGK) test facility using kerosene and oxygen as fuel to generate a combustion chamber-like environment.

During operation, combustion chambers (e.g. of orbital thrusters) need to withstand very high thermo-chemical and thermo-mechanical loads. Because of its low weight and high temperature stability, Ceramic Matrix Composites (CMC, e.g. Cf/SiC material fabricated via the Polymer-Infiltration-Pyrolysis process, PIP) are promising material candidates for this application sector[1]. For protecting the carbon fibers as well as the SiC matrix against oxidation and ablation especially above 1750° C., an Environmental Barrier Coating (EBC) on the Cf/SiC composite material is mandatory[2]. For effective protection the EBC needs to be adherent and without cracks and porosity to withstand erosion, limit evaporation and inhibit oxygen diffusion to the substrate. Furthermore the mechanical compatibility between EBC and CMC substrate material is an important issue to prevent stresses and therefore cracking and spallation of the coating[3]. Among all UHTC materials $HfB_2$ and $ZrB_2$ are the most promising materials, whereas $ZrB_2$ is the most common one. $ZrB_2$ based coatings are deposited using various techniques such as Chemical Vapor Deposition[4], Plasma Spraying[5], Pulsed Laser Deposition[6], Sputtering[7] and Dip-Coating[8], but due to the high requirements on layer thickness, substrate geometry and layer adhesion, none of these coating methods are suitable for inner coatings of small combustion chambers. Therefore, in the present paper the investigation of the High Performance Plasma Coating (HPPC) method is reported for the application of UHTC materials, exemplarily on combustion chambers of small thrusters.

Figure 4A:
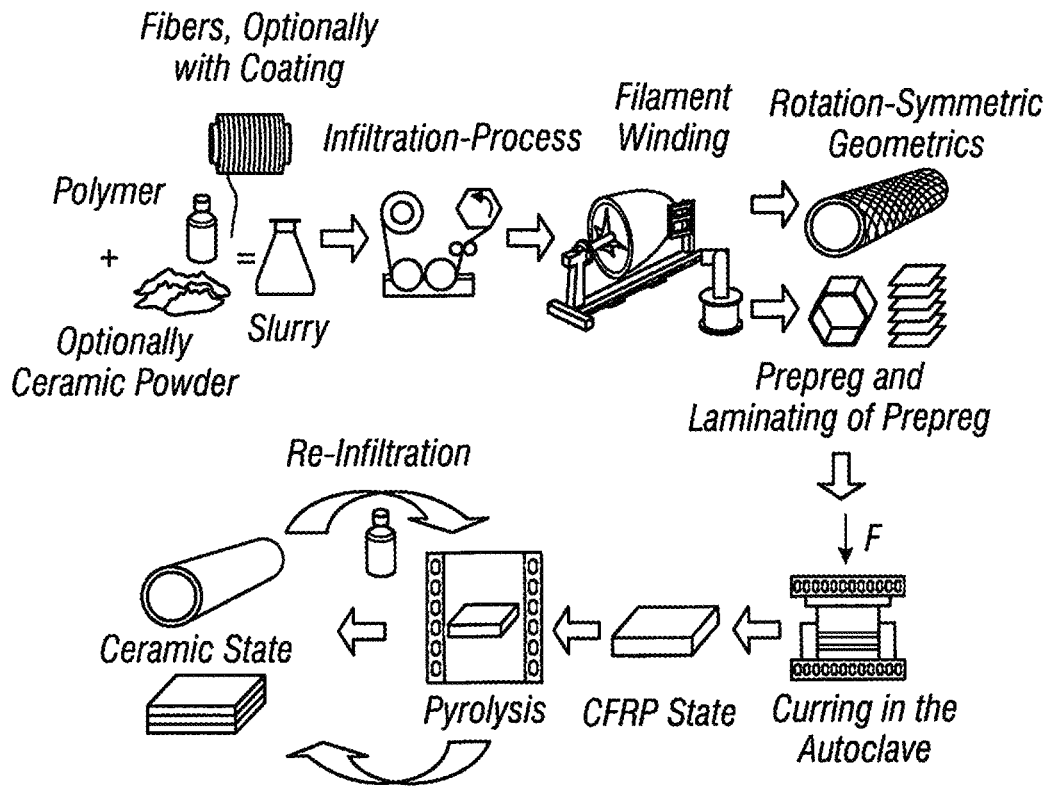
FIGS. 4A and 4B are schematic overviews of the Polymer-Infiltration-Pyrolysis process12 and High Performance Plasma Coating process, respectively.
Figure 4B:
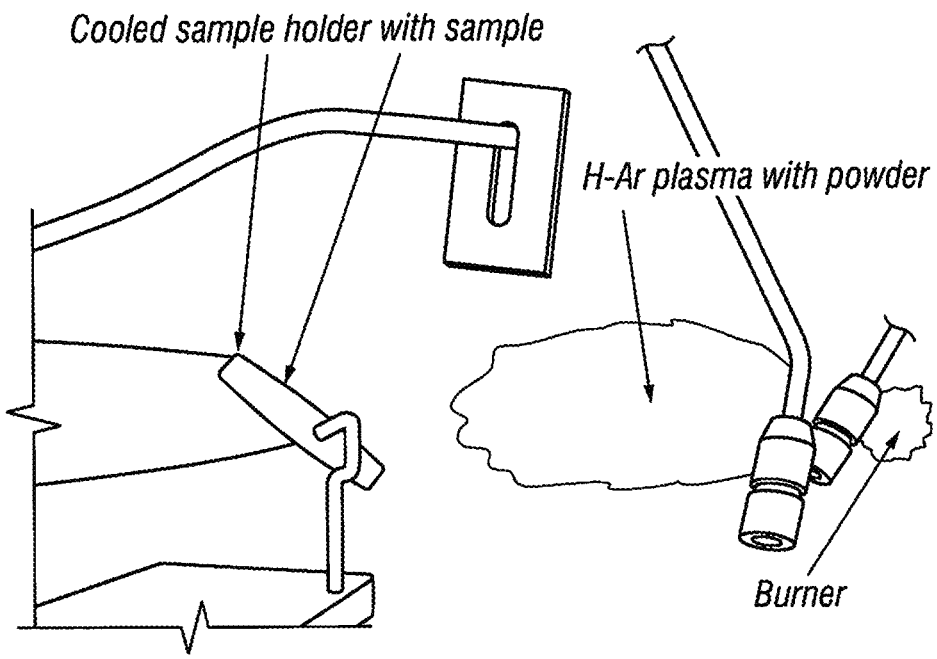

Fabrication of Cf/SiC substrate material via Polymer-Infiltration-Pyrolysis process (PIP). For the substrate material the Airbus Group Cf/SiC material SiCARBON™ is used. Continuous carbon fibers (type T800HB-6000-40B, Toray Industries, Inc., Japan) are coated with a 350 nm pyrolytic carbon (pyC) layer via CVD to optimize fiber/matrix interface. FIGS. 4A and 4B show a schematic overview of the used PIP process. Coated fiber bundles are infiltrated with a pre-ceramic slurry system and uni-directional prepregs are fabricated via filament winding. Green body samples are then manufactured by prepreg lay-up and cross-linking under pressure in an autoclave (100-300° C., 10-20 bar). During a high temperature process step (pyrolysis) between 1100-1700° C. under nitrogen, the polymer based pre-ceramic matrix material is converted into the SiC matrix. The resulting porosity (40-45 vol.-%), due to the polymer shrinkage during transformation into the ceramic state, is reduced by 3 re-infiltration steps with a SiC precursor and subsequent pyrolysis (density 1.78 g/cm$^3$, fiber volume content 54 vol.-%, porosity 23 vol.-%). Coupons with a geometry of 100×100 mm$^2$ are prepared using a diamond disc saw (DIADISC 6200, MUTRONIC Prazisionsgeratebau GmbH & Co. KG, Germany).

High Performance Plasma Coating Process (HPPC)

Before coating the Cf/SiC samples are ultrasonic cleaned in water and isopropyl alcohol for 15 min respectively and dried at 90° C. Coatings are manufactured via the HPPC process (Dr. Laure Plasmatechnologie GmbH, Germany). During coating process (see FIGS. 4A and 4B), an extreme hot H-Ar Plasma (T>10.000 K) is generated in a vacuum tank and the UHTC powder ($ZrB_2$: Grade B, HC Starck, Germany; SiC: Arendal Smelteverk, Norway) is introduced into the hottest zone (inside the plasma jet). Then the ceramic powder-plasma mixture is accelerated to high velocities towards the Cf/SiC SiCARBON™ substrate and finally the coating material condensates on the "cold" substrate surface.

FIG. 4A is a schematic overview of the Polymer-Infiltration-Pyrolysis process[12] and FIG. 4B is a schematic overview of the High Performance Plasma Coating process. It is understood that the HPPC process is not used for UHTC coating of CMC materials so far, common used substrate materials are glasses. The feasibility of $ZrB_2$ coating of CMCs via HPPC is evaluated by coating of glass substrates. The influence of coating parameters such as coating time (12-120 s) and powder material ($ZrB_2$, $ZrB_2$-SiC) are then investigated on Cf/SiC substrates.

Hot-Gas Material Testing in Relevant Environment.

The material behavior of different coating systems is tested using the Airbus Group "Environmental Relevant Burner Rig-Kerosene" (ERBURIGK) test facility. Kerosene and oxygen are used as fuel in order to generate a combustion chamber-like environment. The ERBURIGK test facility is developed from a High Velocity Oxygen Fuel (HVOF) gun. Kerosene and oxygen are distributed by the injector to generate a reproducible and homogenous combustion. The resulting gases are accelerated inside a nozzle[12]. Flat samples are executed in a free hot gas jet (FIG. 2) for 15 min at temperatures of 1800-1900° C. (measured by an high performance infrared thermometer, type Marathon MMGSH, Raytek GmbH, Germany) to investigate thermo-chemical and thermo-mechanical behavior of the $ZrB_2$ based coating material.

Figure 5:
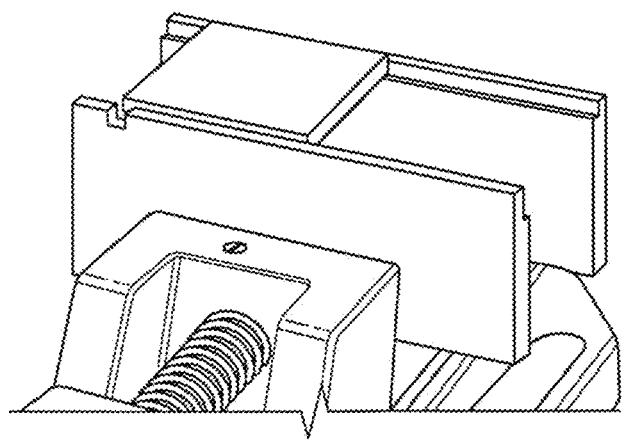
FIG. 5 illustrates a free hot gas jet of the Airbus Group "Environmental Relevant Burner Rig-Kerosene" (ERBURIGK) test facility.

FIG. 5 illustrates free hot gas jet of the Airbus Group "Environmental Relevant Burner Rig-Kerosene" (ERBURIGK) test facility[12].

Material Characterization

Coating microstructure, coating/substrate interface as well as the composition before and after testing are analyzed. The cross-sections of the coated samples are prepared for further analysis. Microstructure is investigated by Scanning Electron Microscope (SEM, Jeol JSM-6320F), the chemical composition is determined by Energy Dispersion X-ray Spectroscopy (EDX, Zeiss Auriga SEM) and X-ray Photoelectron Spectroscopy (XPS, Physical Electronics Quantum 2000). Phases are determined via X-Ray Diffraction (XRD, Siemens Diffraktometer D5000).

Feasibility study of $ZrB_2$ coating with the HPPC method

Figure 6:
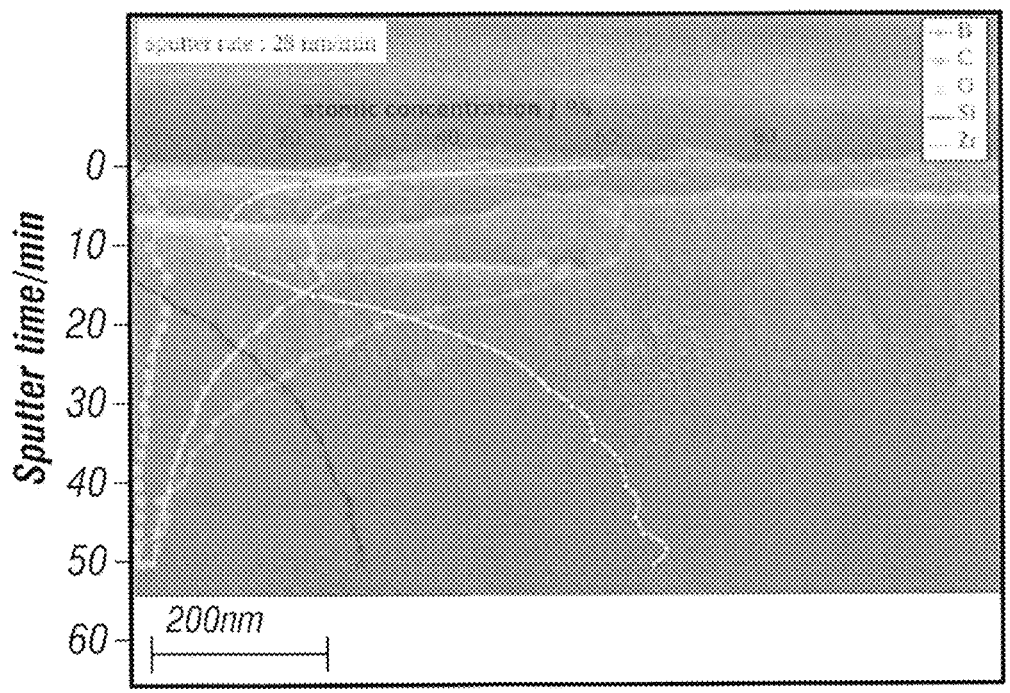
FIG. 6 shows an SEM image of fracture front view of $ZrB_2$ via HPPC on a glass substrate and atomic concentration depth profile via XPS.

FIG. 6 shows the fracture front view of a $ZrB_2$ coating on a glass substrate. The coating is dense and oriented with a good adhesion on the glass substrate and the thickness is less than 600 nm. Due to the high temperatures (1000-2000° C.) which are present during this technique, the coating process is limited to a few seconds (<10 s). Three separated layers are observed, which are also represented by the XPS depth profile (sputtering rate 28 nm/min). The top layer (~77 nm) mainly consists of carbon (Ø 15 at.-%), oxygen (Ø 36 at.-%), zirconium (Ø 22 at.-%) and boron (Ø 28 at.-%). Compared to this layer, the carbon (Ø 3 at.-%) and oxygen (Ø 12 at.-%) content decreases inside the intermediate layer (~135 nm), whereas the boron (Ø 62 at.-%) content increases and the zirconium (Ø 23 at.-%) content is even higher as in the top layer. The third layer depicts silicon (Ø 11 at.-%) and oxygen (Ø 33 at.-%) and decreased zirconium (Ø 16 at.-%) and boron (Ø 37 at.-%). The top layer results from contamination with carbon and oxygen after removing the sample from the vacuum tank. The third layer is a mixture of $ZrB_2$ and the glass substrate. It is expected that this layer is formed due to the high temperatures during coating process. Therefore only the small intermediate layer is the desired pure $ZrB_2$ coating. In all three layers the Zr/B atomic ratio is smaller than the necessary ratio for $ZrB_2$ of 1/2 (real ratio 1/1,4-1/2,8). The XPS analysis of the glass substrate in coating near region reflects a low amount of boron (<15 at.-%). An EDX analysis of the glass substrate far from coating and surface indicates a boron content of about 29 at.-%. As a borosilicate glass is used, it is expected that due to the high temperatures during coating process, the boron is solved from the substrate surface and therefore the coating contains a higher amount of boron than provided by the $ZrB_2$.

Figure 7A:
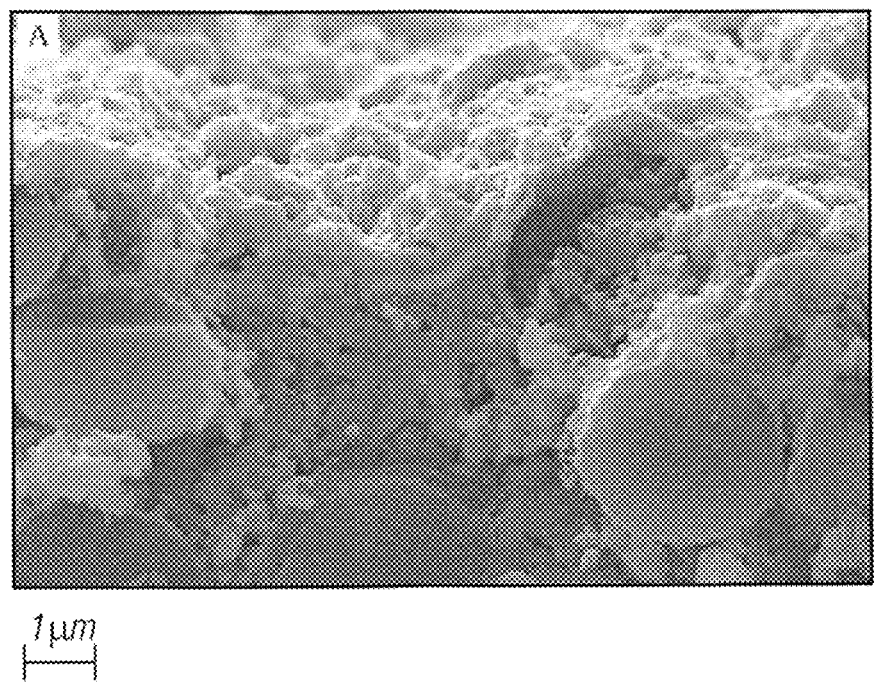
FIG. 7A shows an SEM image of fracture and FIG. 7B shows an atomic concentration depth profile via XPS of a $ZrB_2$ coating, fabricated with 12 seconds coating time on a Cf/SiC SiCARBON™ substrate.
Figure 7B:
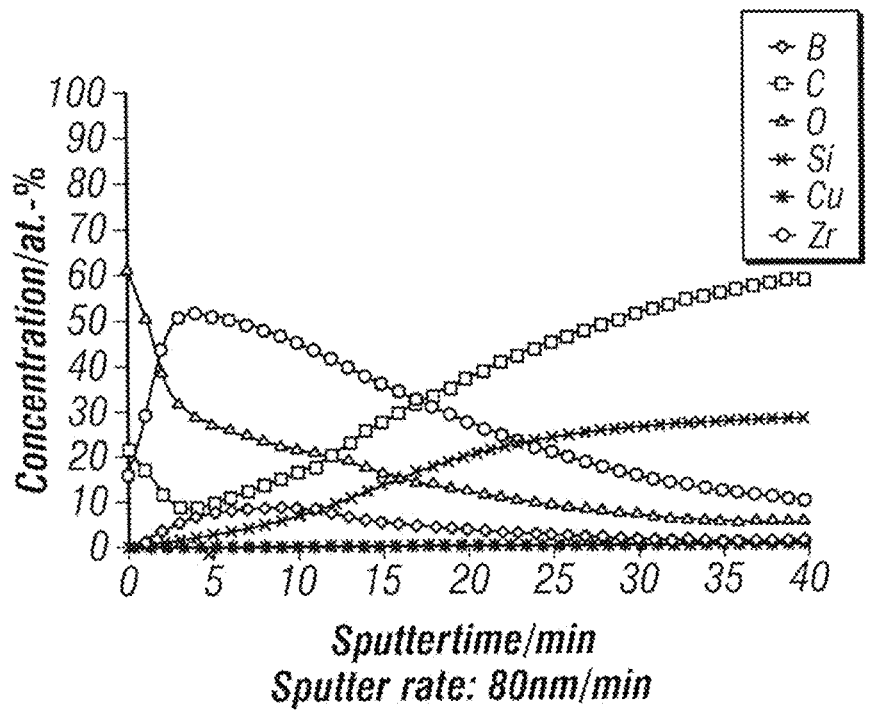

As stated above, FIG. 6 illustrates an SEM image of fracture front view of $ZrB_2$ via HPPC on a glass substrate and atomic concentration depth profile via XPS Longer coating times are feasible on Cf/SiC SiCARBON™ substrates. The fracture of a $ZrB_2$ coating (duration 12 s) on Cf/SiC SiCARBON™ substrate is shown in FIGS. 7A and 7B. The total thickness of this coating is about 3 µm, but it appears less dense and irregular. The atomic concentration depth profile in FIG. 7B (sputtering rate 80 nm/min) is completely different to the one in FIG. 6. The atomic Zr/B ratio of the $ZrB_2$ coating on Cf/SiC SiCARBON™ substrate is vice versa to that on the glass substrate. While the coating on the glass substrate shows a higher amount of boron, for the coating on Cf/SiC SiCARBON™ substrate the boron content is about 1/5 of zirconium. A high amount of oxygen inside the coating is observed, so it can be concluded that it is present during HPPC process and reacts with $ZrB_2$ to $B2O3$. The $B2O3$ evaporates at temperatures above 1200° C.14, which results in a higher Zr/B ratio (~5/1). Furthermore a higher amount of $ZrO2$ is determined. Consequently, decrease the amount of oxides inside the coating, the vacuum level has to be increased.

XRD phase analysis of the $ZrB_2$ coating is only possible for the coating on Cf/SiC SiCARBON™ substrate. As the XRD analysis provides no results for the $ZrB_2$ coating on glass substrate, it is expected that amorphous $ZrB_2$ is created on glass substrate. In comparison a crystalline $ZrB2$ phase is obtained on the Cf/SiC SiCARBON™ substrate. As stated above, FIG. 7A shows an SEM image of fracture and FIG. 7B shows an atomic concentration depth profile via XPS of a $ZrB_2$ coating, fabricated with 12 second coating time on a Cf/SiC SiCARBON™ substrate.

Influence of Coating Time on Coating Thickness and Microstructure

SEM micrographs of $ZrB_2$ coatings on Cf/SiC SiCARBON™ substrates are shown in FIGS. 8A through 8D. In order to investigate the influence of coating time on coating thickness and microstructure, samples are placed inside the plasma jet for different durations (coating times 12 s, 60 s, 90 s, 120 s). The coating time of 12 s (FIG. 8A) results in a coating thickness of about approx. 3 µm. Coating time of 60 s (FIG. 8B), 90 s (FIG. 8C) and 120 s (FIG. 8D) lead to coating thicknesses of approx. 8 µm, 16 µm and 20 µm respectively. Thus, as can be appreciated from FIGS. 8A through 8D: SEM images of HPPC based ZrB2 coatings on Cf/SiC SiCARBON™ substrates with a coating time of 12 s (FIG. 8A), 60 s (FIG. 8B), 90 s (FIG. 8C), 120 s (FIG. 8D)

Figure 9:
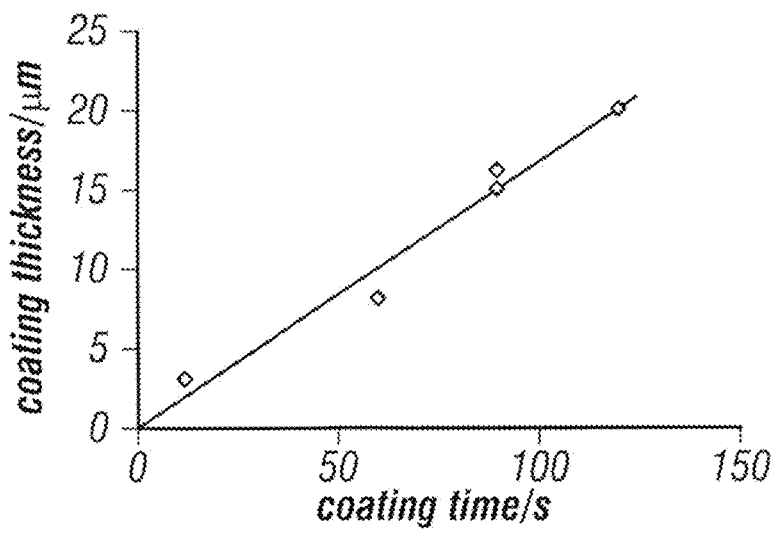
FIG. 9 shows a coating thickness of HPPC based $ZrB_2$ coatings on Cf/SiC SiCARBON™ depending on the coating time.

In FIG. 9 it can be seen that the coating thickness increases with the coating time. Independent from the coating time, all layers show a relatively dense structure. However, brittle $ZrB_2$ coatings show cracks. It is expected that this results from the CTE mismatch between $ZrB_2$ (5,9×10-6 K-1)14 and the Cf/SiC SiCARBON™ (in plane 2×10-6 K-1)15 substrate material. These cracks could be reduced by adding a more ductile phase with a lower CTE, for example SiC (4,3×10-6 K-1)14. By decreasing the CTE mismatch, thermal stresses due to the extreme temperatures (1000-2000° C.) during coating process could be reduced and less cracks will be introduced. In FIG. 9, coating thickness of HPPC based $ZrB_2$ coatings on Cf/SiC SiCARBON™ depending on the coating time is shown.

Figure 10A:
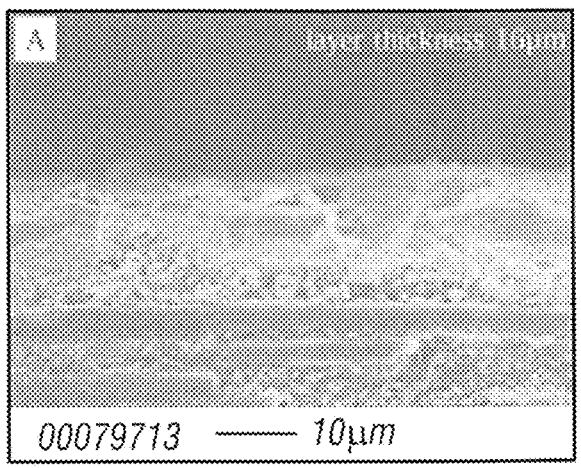
FIG. 10A shows a fracture, and surface FIG. 10B of a HPPC based $ZrB_2$ coating with a coating time of 90 s on Cf/SiC SiCARBON™ substrate.
Figure 10B:
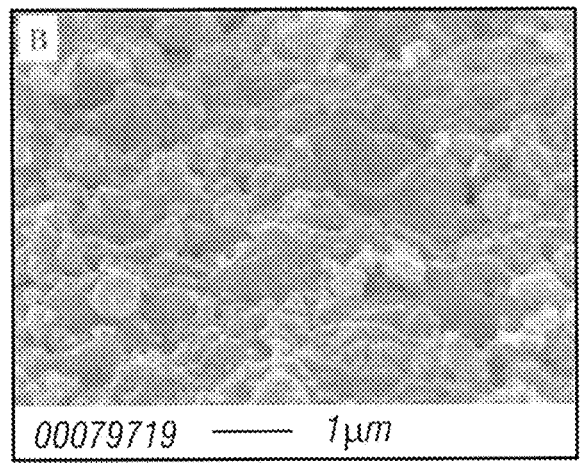

Influence of Powder Material on Coating Microstructure, Adhesion and Composition FIG. 10A shows fracture, and FIG. 10B shows a surface of a HPPC based $ZrB_2$ coating applied with 90 s coating time. It can be observed that a very dense and homogenous layer is obtained and cracks and even spalling of the coating is present. It is expected that thermally induced stresses created during cooling step could not relax due to the absence of pores. Thus, FIG. 10A shows fracture and surface FIG. 10B shows a surface, of a HPPC based $ZrB_2$ coating with a coating time of 90 s on Cf/SiC SiCARBON™ substrate. The 90 wt.-% ZrB2-10 wt.-% SiC coating with a coating time of 90 s in FIG. 8C shows a homogenous layer. Compared to the pure $ZrB_2$ coating (FIG. 7A) the structure is less dense and at the top surface single particles can be observed. The amount of cracks is significantly reduced compared to the $ZrB_2$ coating.

Figure 11A:
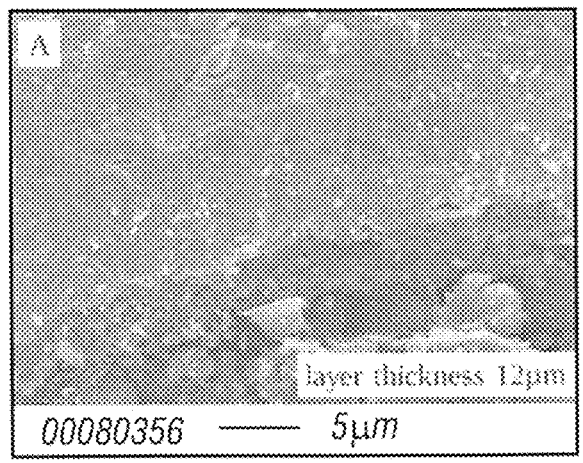
FIG. 11A shows a fracture.
Figure 11B:
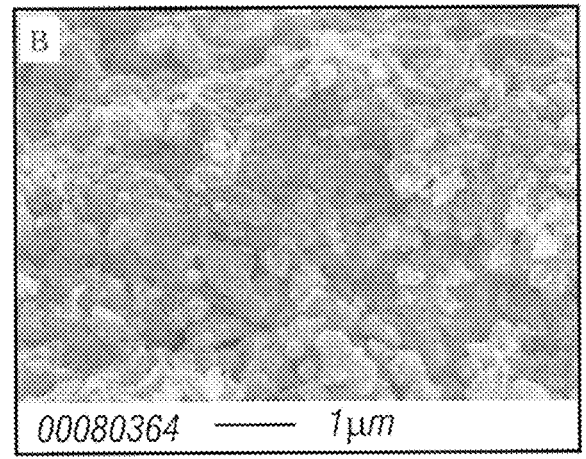
FIG. 11B shows a surface, of a HPPC based 90 wt.-% ZrB2-10 wt.-% SiC coating with a coating time of 90 s on Cf/SiC SiCARBON™ substrate.
Figure 12A:
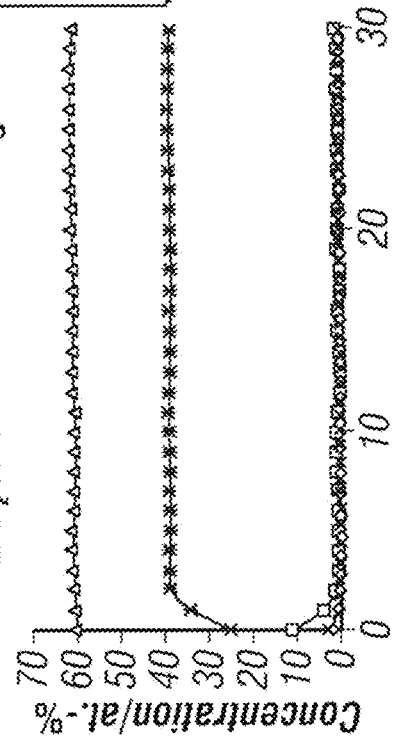
FIGS. 12A and 12B illustrate XPS atomic concentration depth profiles of HPPC based $ZrB_2$ and ZrB2-SiC coatings, respectively on Cf/SiC SiCARBON™ substrates.
Figure 12B:
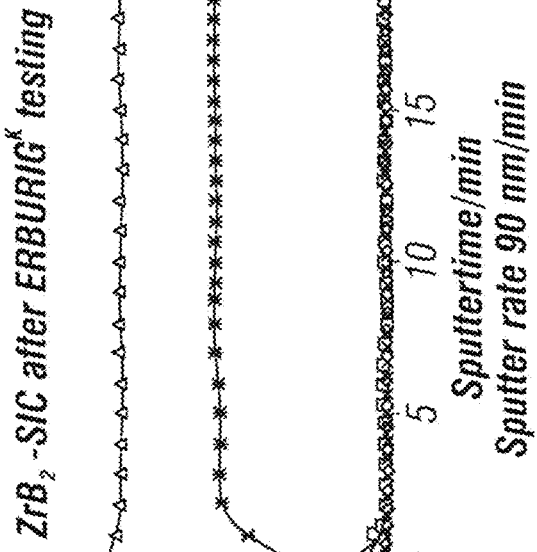

FIGS. 11A and 11B illustrate fracture (FIG. 11A) and surface (FIG. 11B) of a HPPC based 90 wt.-% ZrB2-10 wt.-% SiC coating with a coating time of 90 s on Cf/SiC SiCARBON™ substrate. FIGS. 12A and 12B show a comparison of coating compositions depending on powder material (pure ZrB2 and 90 wt.-% ZrB2-10 wt.-% SiC). XPS depth analysis (sputtering rate 90 nm/min) of the $ZrB_2$ coating (FIGS. 12A and 12B) reflects an increase of zirconium (up to 50 at.-%) and boron (up to 35 at.-%) content and a decrease of carbon (from 50 to 5 at.-%) content down to a depth of 1,6 µm. However, the zirconium (~45 at.-%) and carbon (~10 at.-%) content of the $ZrB_2$-SiC coating (FIGS. 12A and 12B) is almost constant from a depth of 250 nm up to 1,6 µm. The boron content is slightly increasing (up to 25 at.-%) while oxygen content decreases (down to 25 at.-%). The differences of the composition at the top surface are due to the contamination at air after removing the samples from the vacuum tank. A higher amount of silicon (~6 at.-%) is detected in the $ZrB_2$ coating compared to the $ZrB_2$-SiC coating (~2,8 at.-%). An EDX analysis of the $ZrB_2$-SiC coating shows that the silicon is mainly located at the coating bottom. The reason for this separation is not yet understood, but it is expected that due to different powder properties (e.g. particle size, density) the $ZrB_2$-SiC mixture is separated inside the HPPC powder feeder. Because of this fact the $ZrB_2$-SiC coating is less homogenous, which is in contrary to the XPS results. The explanation for this contrast is, that the XPS analysis method only determines the exact composition of a very small spot and depth, whereas the EDX analysis reflects a general but less precise view of the coating composition, since the quantitative determination of the very light boron atom is difficult with this method. Notwithstanding this effect a gradient, which results in a slow transition of composition from the substrate to the coating, could be observed, and the coating adhesion seems to be improved.

As indicated, FIGS. 12A and 12B show XPS atomic concentration depth profiles of HPPC based $ZrB_2$ (FIG. 12A) and $ZrB_2$-SiC (FIG. 12B) coatings on Cf/SiC SiCARBON™ substrates.

Figure 13A:
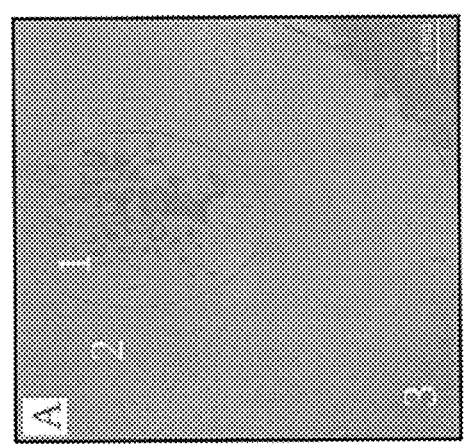
FIGS. 13A through 13C illustrate macroscopic morphologies of HPPC based $ZrB_2$ (FIG. 13A) and $ZrB_2$-SiC (FIG. 13B) coatings on Cf/SiC SiCARBON™ after 15 min ERBURIGK testing at 1800° C.–1900° C.; and macroscopic morphology of CVD-SiC coating on Cf/SiC SiCARBON™ tested at the same conditions for 105 min (FIG. 13C)
Figure 13B:
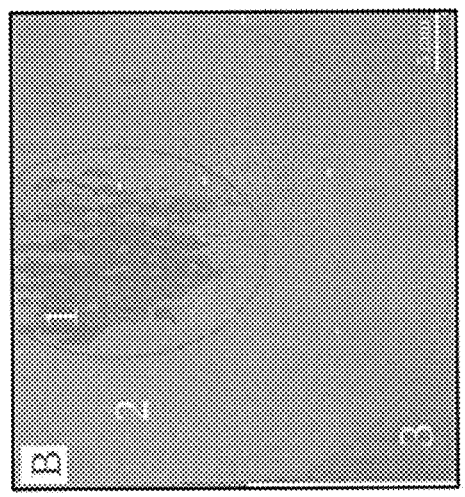
Figure 13C:
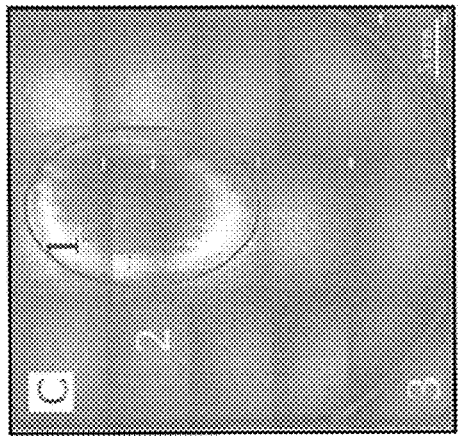

Investigation of Thermo-Chemical and Erosion Behavior of HPPC Based ZrB2 Coatings During testing of the HPPC based $ZrB_2$ coatings for 15 min in the ERBURIGK test facility, the surface of the central sample region reaches temperatures between 1800° C. and 1900° C. The hot gas jet mainly contains of the combustion gases steam, oxygen, carbon monoxide, carbon dioxide and hydrogen12 and the gas velocity at the sample surface is about 1300 m/s. A reference coating (CVD-SiC, Schunk Kohlenstofftechnik GmbH, Germany) on Cf/SiC SiCARBON™, which reflects the current state of the art, is tested at the same conditions for 105 min. The macroscopic morphologies of the HPPC based $ZrB_2$ (FIG. 10A), HPPC based $ZrB_2$-SiC (FIG. 10B) and the CVD-SiC (FIG. 10C) on Cf/SiC SiCARBON™ are shown in. The tested surface can be classified into three zones. For both HPPC coated Cf/SiC SiCARBON™ samples the coating in the central region (approx. 12 mm for (FIG. 10A) and approx. 15 mm for (FIG. 10B)) (1) is characterized by spallation in particular for the $ZrB_2$-SiC coating. The intermediate regions (40 mm for (FIG. 10A) and (FIG. 10B)) (2) of the HPPC based coatings show a light color without spallation and a few macro-cracks can be detected. The coating in the border region (3) shows a dark color similar to the coating before testing. It is supposed that this coating area is still not oxidized. For one sample the $ZrB_2$ coating is fully removed in one part of the border region (FIGS. 13A through 13C). No spallation of the reference CVD-SiC coating is observed even after 105 min and only a few micro-cracks and discoloration can be detected. The work in this paper is addressed only to determine the HPPC material behavior within the two zones central region (1) and the intermediate region (2). Thus, FIGS. 13A through 13C shows macroscopic morphologies of HPPC based $ZrB_2$ (FIG. 13A) and $ZrB_2$-SiC (FIG. 13B) coatings on Cf/SiC SiCARBON™ after 15 min ERBURIGK testing at 1800° C.–1900° C.; and FIG. 13C shows macroscopic morphology of CVD-SiC coating on Cf/SiC SiCARBON™ tested at the same conditions for 105 min.

Figures 14A, 14B, 14C:
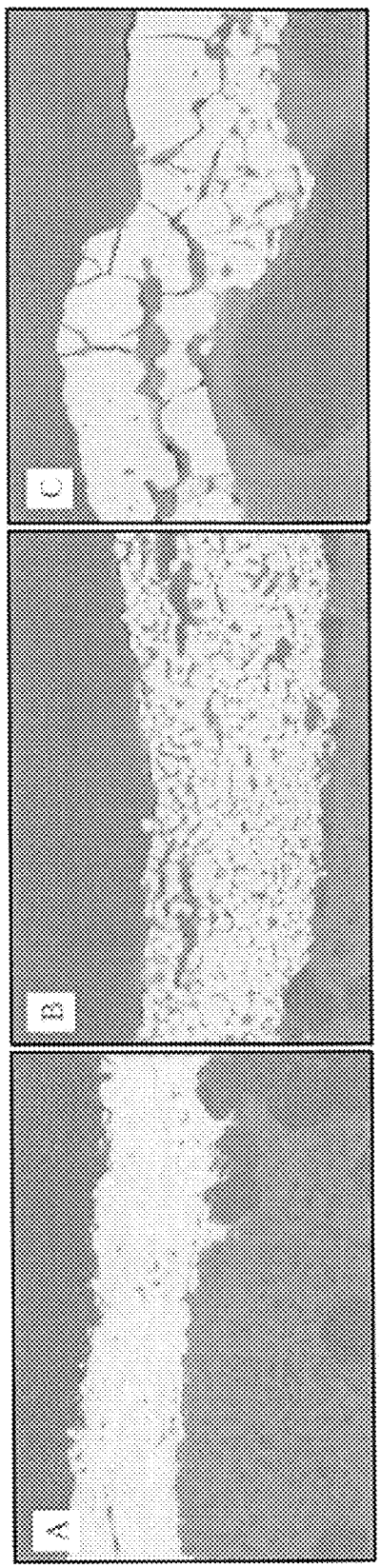
FIGS. 14A through 14F show cross-sections of HPPC based $ZrB_2$ and ZrB2-SiC coatings on Cf/SiC SiCARBON™ substrate before (FIGS. 14A and 14D) and after ERBURIGK testing; an intermediate region (FIGS. 14B and 14E) and central region (FIGS. 14C and 14F)
Figures 14D, 14E, 14F:
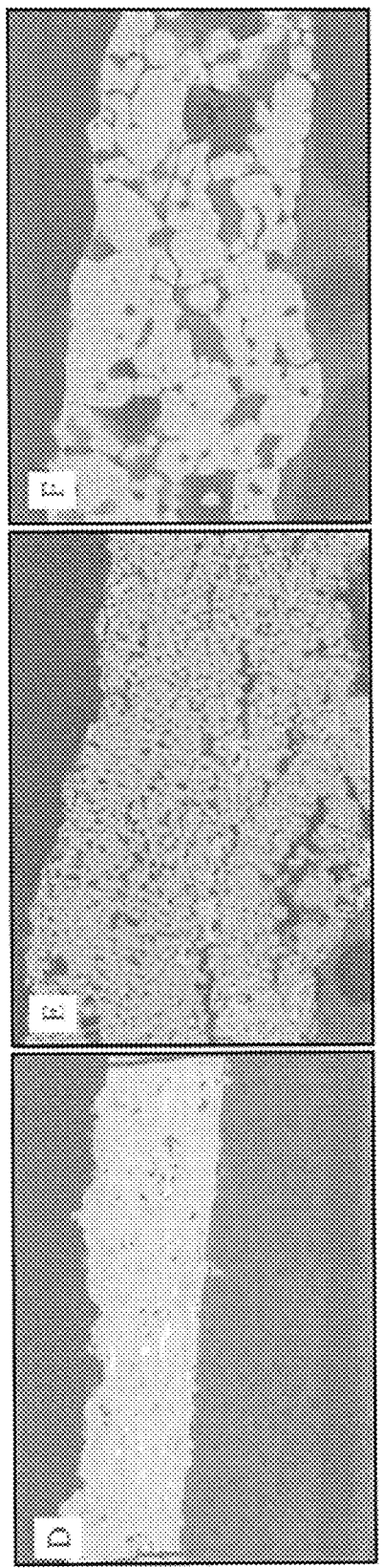
Figure 15B:
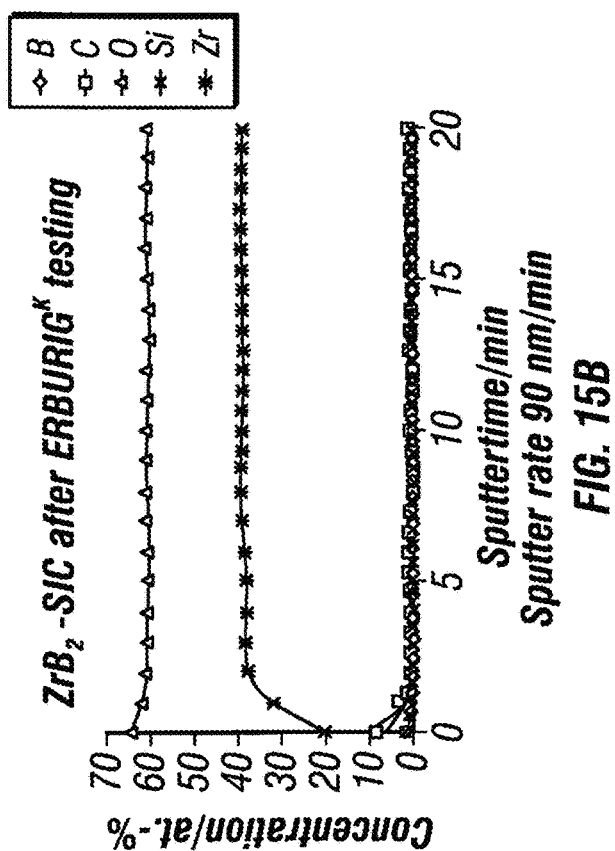
FIGS. 15A and 15B illustrate XPS atomic concentration depth profiles of HPPC based $ZrB_2$ (FIG. 15A) and $ZrB_2$-SiC (FIG. 15B) coatings on Cf/SiC SiCARBON™ substrates after ERBURIGK testing for 15 min at 1800-1900° C.
Figure 15A:
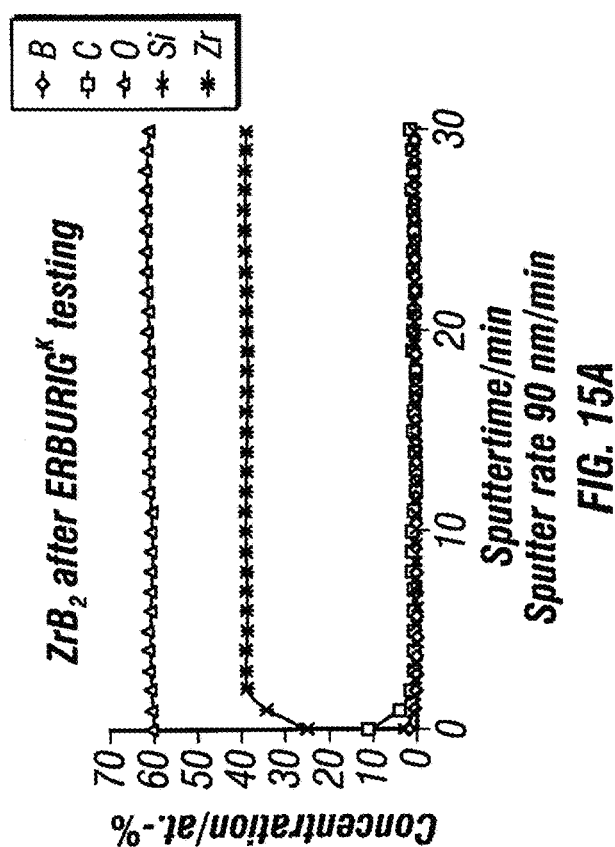

FIGS. 14A-14F show cross-sections of the HPPC based $ZrB_2$ and $ZrB_2$-SiC coatings before and after ERBURIGK testing. Before testing (FIGS. 14A and 14D) both coatings show an oriented structure parallel to the surface, the spraying layers can be clearly recognized. Some pores and separated layers exist, but both coatings are compact. After testing no continuous layer is observed anymore. The microstructure of both coatings seems to be similar after testing, no orientation can be observed. It is expected that the coatings are recrystallized during hot gas testing. The coating in the intermediate region (FIGS. 14B and 14E) shows small (<3 µm), globular and separated grains. Compared to this area, coating segments in the central region (FIGS. 14C and 14F) contains large grains (>3 µm) and less pores, which creates a more dense coating. It is presumed that this coating microstructure results due to the very high temperatures during testing in the central region. Sintering and grain growth of zirconium oxide is supported by the high temperatures17. Again, FIGS. 14A through 14F show cross-sections of HPPC based $ZrB_2$ and $ZrB_2$-SiC coatings on Cf/SiC SiCARBON™ substrate before (FIGS. 14A and 14D) and after ERBURIGK testing; intermediate region (FIGS. 14B and 14E) and central region (FIGS. 14C and 14F). FIGS. 15A and 15B show the XPS atomic concentration depth profiles (sputtering rate 90 nm/min) of the $ZrB_2$ (FIG. 12A) and $ZrB_2$-SiC (FIG. 12B) coatings after ERBURIGK testing. The coating only consists of zirconium and oxygen, whereas no silicon, carbon and boron are detected inside the coating. The very top surface shows a different composition due to contamination during sample cutting after testing.

FIGS. 15A and 15B show XPS atomic concentration depth profiles of HPPC based $ZrB_2$ (FIG. 15A) and $ZrB_2$-SiC (FIG. 15B) coatings on Cf/SiC SiCARBON™ substrates after ERBURIGK testing for 15 min at 1800-1900° C. with the XRD analysis of the $ZrB_2$ (FIG. 13A) and the $ZrB_2$-SiC (FIG. 13B) coating surfaces after testing there is no obvious difference between the coatings. Both coatings are mainly composed of monoclinic ZrO2. Furthermore, small amount of SiC can be detected which is most likely the underlying substrate material (due to the measurement depth of XRD method) and indicates initial material. Main expected reactions of the HPPC based $ZrB_2$ coatings during ERBURIGK hot gas testing are17:

$$ZrB2(s)+5/2O2(g) \rightarrow ZrO2(s)+B2O3(l) \quad (1)$$

$$B2O3(l) \rightarrow B2O3(g) \quad (2)$$

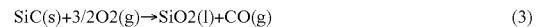

$$SiC(s)+3/2O2(g) \rightarrow SiO2(l)+CO(g) \quad (3)$$

$$SiC(s)+O2(g) \rightarrow SiO(g)+CO(g) \quad (4)$$

$$SiO2(l) \rightarrow SiO2(g) \quad (5)$$

$$SiO2(l) \rightarrow SiO(g)+1/2O2(g) \quad (6)$$

Reactions 1 and 2 are present in both coatings, whereas reactions 3-6 only take place for the $ZrB_2$-SiC coating. Due to the high amount of gaseous products a porous structure is formed.

Figure 16:
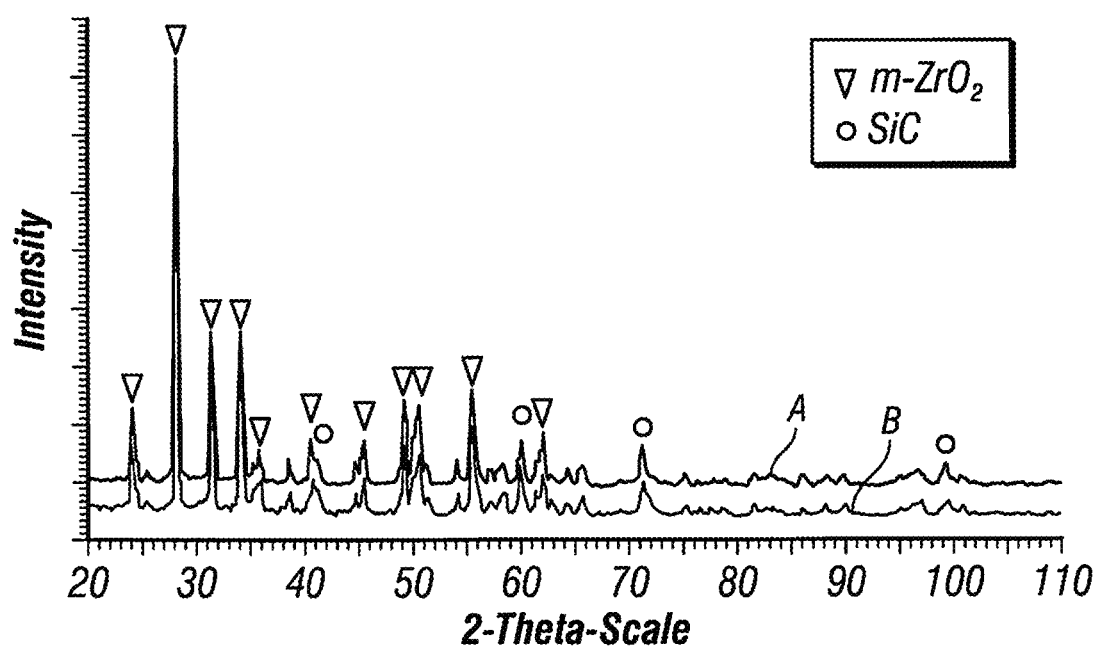
FIG. 16 shows surface XRD pattern of HPPC based $ZrB_2$ and $ZrB_2$-SiC coatings on Cf/SiC SiCARBON™ after ERBURIGK testing for 15 min at 1800-1900° C.

FIG. 16 shows a surface XRD pattern of HPPC based $ZrB_2$ and $ZrB_2$-SiC coatings on Cf/SiC SiCARBON™ after ERBURIGK testing for 15 min at 1800-1900° C. After hot gas testing the samples experienced a very fast cooling, which results in the transformation of ZrO2 from cubic to monoclinic phase. This transformation is accompanied by a high dilatation. This can be observed by an increase of the coating thickness from about 10 µm before to about 15-20 µm after testing. In order to the sharp-edged view of the remaining $ZrB_2$ coating in the central region it is expected that this is due to spallation. Most likely this is a consequence of the high coefficient of thermal expansion (CTE) of ZrO2 (10,8×10-6 K-1)17 compared to the CTE of the Cf/SiC substrate material (in plane 2×10-6 K-1). In contrast to that, the $ZrB_2$-SiC coating in the center region appears more like an eroded material, but this is not unlikely as this material could be removed by the high gas velocities (~1300 m/s) due to the lower melting point of SiO2 (1600° C.18) compared to ZrO2 (2680° C.17). Both coatings in its current development state are not yet sufficient for complete protection of the Cf/SiC SiCARBON™ substrate material against thermo-chemical attack. Further development for a sufficient protective coating for Cf/SiC composites especially for long term applications (e.g. up to 15 h) is therefore mandatory.

ZrB2 based coatings on Cf/SiC SiCARBON™ substrates are developed by High Performance Plasma Coating process (HPPC). The influence of substrate material and coating time on coating microstructure, thickness and composition are investigated. Coating thickness is influenced by the coating time. Coating thicknesses up to 20 μm are achieved with coating times up to 120 s. Due to the present oxygen the composition of the powder mixture does not represent the final coating composition. The addition of SiC to $ZrB_2$ results in a graded coating with a high amount of $ZrB_2$ at the top surface. This gradient seems to create a better adhesion to the Cf/SiC SiCARBON™ substrate material. After testing of the HPPC based coatings in the Airbus Group ERBURIGK test facility for 15 min at 1800-1900° C., spallation of the coating in the center region is observed. The coating in intermediate regions still exists, but shows a porous microstructure and is not protective for the Cf/SiC SiCARBON™ substrate material. In the present development state, the HPPC based coatings still do not present sufficient protection of the Cf/SiC SiCARBON™ material, therefore further research work is necessary.

REFERENCES

1. M. Pavese, P. Fino, C. Badini, A. Ortona, G. Marino (2008): HfB2/SiC as a protective coating for 2D Cf/SiC composites: Effect of high temperature oxidation on mechanical properties. *Surface and Coatings Technology* 202, Issue 10, 2059-2067.
2. K. Lee, D. Fox, R. Robinson, N. Bansal (2001): Environmental Barrier Coatings for Silicon-Based Ceramics. *High Temperature Ceramic Matrix Composites*, Eds. W. Krenkel, R. Naslain, H. Schneider, 224-229.
3. E. Corral (2008): Ultra-high temperature ceramic coatings. *Advanced Materials & Processes*, October, 30-32.
4. J. Pierson, T. Belmonte, H. Michel (2001): Thermodynamic and experimental study of low temperature $ZrB_2$ chemical vapor deposition. *J. Phys. IV France* 11, Pr3-85-Pr3-91.
5. M. Tului, F. Ruffini, F. Arezzo, S. Lasisz, Z. Znamirowski, L. Pawlowski (2002): Some properties of atmospheric air and inert gas high-pressure plasma sprayed $ZrB_2$ coatings. *Surface and Coatings Technology* 151-152, 483-489.
6. J. V. Rau, D. Ferro, M. B. Falcone, A. Generosi, V. Rossi Albertini, A. Latini, R. Teghil, S. M. Barinov (2008): Hardness of zirconium diboride films deposited on titanium substrates. *Materials Chemistry and Physics* 112, Issue 1, 504-509.
7. L. Tengdelius, M. Samuelsson, J. Jensen, J. Lu, L. Hultman, U. Forsberg, E. Janzen, H. Hogberg (2014): Direct current magnetron sputtered $ZrB_2$ thin films on 4H-SiC(0001) and Si(100). *Thin Solid Films* 550, 285-290.
8. Y. Blum, J. Marschall, H. J. Kleebe (2006): Low Temperature, Low Pressure Fabrication of Ultra High Temperature Ceramics (UHTCs). Final Report: AFRL-ML-WP-TR-2006-4200.
9. M. J. Gasch, D. T. Ellerby, S. M. Johnson (2005): Ultra High Temperature Ceramic Composites. *Handbook of Ceramic Composites*, Ed. N. P. Bansal, 197-224.
10. K. Cunzeman, P. Schubert (2009): Survey of Ultra-High Temperature Materials for Applications Above 2000 K. *AIAA Space* 2009 *Conference & Exposition*, 6508.
11. P. Sarkisov, N. Popovich, L. Orlova, Y. Anan'eva (2008): Barrier coatings for type C/SiC ceramic-matrix composites (Review). *Glass and Ceramics* 65, Issue 9-10, 366-371.
12. S. Schmidt-Wimmer, S. Beyer, F. Wigger, K. Quering, K. Bubenheim, C. Wilhelmi (2012): Evaluation of Ultra High Temperature Ceramics and Coating-Systems for their Application in Orbital and Air-Breathing Propulsion. *AIAA/3AF International Space Planes and Hypersonic Systems and Technologies Conference*, 5908.
13. D. Glass (2011): Physical Challenges and Limitations Confronting the Use of UHTCs on Hypersonic Vehicles. *17th AIAA International Space Planes and Hypersonic Systems and Technologies Conference*, 2304.
14. M. Mallik, A. Kailath, K. Ray, R. Mitra (2012): Electrical and thermophysical properties of $ZrB_2$ and $HfB_2$ based composites. *Journal of the European Ceramic Society* 32, Issue 10, 2545-2555.
15. G. Motz, S. Schmidt, S. Beyer (2008): The PIP-Process: Precursor Properties and Applications. *Ceramic Matrix Composites: Fiber Reinforced Ceramics and their Applications*, Ed. W. Krenkel, 165-186.
16. Y. Wang, H. Li, Q. Fu, H. Wu, L. Liu, C. Sun (2013): Ablation behavior of a TaC coating on SiC coated C/C composites at different temperatures. *Ceramics International* 39, Issue 1, 359-365.
17. J. Han, P. Hu, X. Zhang, S. Meng, W. Han (2008): Oxidation-resistant $ZrB_2$-SiC composites at 2200° C. *Composites Science and Technology* 68, Issue 3-4, 799-806.
18. S. Kumari Sahu, A. Navrotsky (2008): High-Temperature Materials Chemistry and Thermodynamics. *High Temperature Materials and Mechanisms*, Ed. Y. Bar-Cohen, 17-38.

What is claimed is:

1. A structure for high temperature application comprising:
   a base structure which includes a ceramic composite material; and
   a coating material provided on a surface of the base structure, the coating material comprising a metal boride and a metal carbide, and the coating material having a graded structure with a higher amount of the metal boride at an outer surface of the coating material.

2. The structure according to claim 1, wherein at least one of the following
   the base structure has fibers and a matrix; and
   the coating has a thickness of 0.1 μm to 200 μm.

3. The structure according to claim 2, wherein at least one of the following
   the fibers are formed from one or several fiber materials, which are selected from a group of fiber materials which comprises C, ceramic materials, SiC, HfC, ZrC, TaC, TiC, $ZrB_2$, $HfB_2$, $TiB_2$, $TaB_2$ and $NbB_2$ and nitride materials; and
   the matrix is formed from one or several matrix materials which are selected from a group of matrix materials comprising C, ceramic matrix materials, SiC, SiSiC, HfC, ZrC, TaC, TiC, $ZrB_2$, $HfB_2$, $TiB_2$, $TaB_2$ and $NbB_2$ and nitride materials.

4. The structure according to claim 2, wherein
   the coating comprises at least one of SiC, HfC, ZrC, TaC, TiC, $ZrB_2$, Hfi2, $TiB_2$, $TaB_2$ and $NbB_2$ and nitride materials.

5. The structure according to claim 2, wherein
   the coating is formed from $ZrB_2$ and SiC.

6. The structure according to claim 2, wherein
the base structure comprises carbon fibers Cr and an SiC matrix.

7. The structure according to claim 2, wherein the coating comprises at least one of the following
at least one glassy substance; and
a graded surface; and
a mixture of a metal oxide with boron oxide or semimetal oxide at its surface.

8. The structure according to claim 1, wherein
the coating comprises at least one of SiC, HfC, ZrC, TaC, TiC, $ZrB_2$, $HfB_2$, $TiB_2$, $TaB_2$ and $NbB_2$ and nitride materials.

9. The structure according to claim 1, wherein
the coating is formed from $ZrB_2$ and SiC.

10. The structure according to claim 1, wherein
the base structure comprises carbon fibers Cr and an SiC matrix.

11. The structure according to claim 1, wherein the coating comprises at least one of the following
at least one glassy substance; and
a mixture of a metal oxide with boron oxide or semimetal oxide at its surface.

* * * * *